United States Patent
Aratani (10) Patent No.: US 7,573,274 B2
(45) Date of Patent: Aug. 11, 2009

(54) CURRENT SENSOR

(75) Inventor: Masahiro Aratani, Okazaki (JP)

(73) Assignee: DENSO CORPORATION, Kariya (JP)

( * ) Notice: Subject to any disclaimer, the term of this patent is extended or adjusted under 35 U.S.C. 154(b) by 200 days.

(21) Appl. No.: 11/826,555

(22) Filed: Jul. 17, 2007

(65) Prior Publication Data

US 2008/0030208 A1 Feb. 7, 2008

(30) Foreign Application Priority Data

Aug. 4, 2006 (JP) ............... 2006-213574

(51) Int. Cl.
*G01R 27/08* (2006.01)
*G01R 33/12* (2006.01)

(52) U.S. Cl. ................... 324/713; 324/117 R (58) Field of Classification Search ............ 324/426, 324/713, 117 R, 117 H
See application file for complete search history.

(56) References Cited

U.S. PATENT DOCUMENTS

| 4,362,990 A * | 12/1982 | Schneider et al. ....... 324/117 R |
| 4,675,255 A | 6/1987 | Pfeifer et al. |
| 6,441,604 B1 * | 8/2002 | Gohara et al. ........... 324/117 H |
| 6,489,693 B1 | 12/2002 | Hetzler |
| 6,515,468 B1 * | 2/2003 | Morimoto et al. ....... 324/117 H |
| 2007/0090826 A1 * | 4/2007 | Itoh ...................... 324/117 R |

FOREIGN PATENT DOCUMENTS

| DE | 100 49 071 A1 | 4/2002 |
| DE | 203 18 266 U1 | 2/2004 |
| JP | A-8-115802 | 5/1996 |
| JP | A-9-045865 | 2/1997 |
| JP | A-9-213503 | 8/1997 |
| JP | A-11-307301 | 11/1999 |
| JP | A-2001-272422 | 10/2001 |

OTHER PUBLICATIONS

Office Action mailed on Mar. 24, 2009 from the German Patent Office in the corresponding German patent application No. 10 2007 034 757.1-35 (with English translation).

* cited by examiner

*Primary Examiner*—Vincent Q Nguyen
(74) *Attorney, Agent, or Firm*—Posz Law Group, PLC (57) ABSTRACT

A current sensor includes a busbar, a case, a connector, and a bare chip having a current detection circuit. The busbar has a crimp terminal at one end, a ring terminal at the other end, and a shunt resistor welded between the crimp and ring terminals. The shunt resistor is encapsulated in the case, and the busbar has an electrode exposed to a sealed inner room of the case. The connector has a connector body unitary with the case and has a connector terminal that is exposed to the inner room at one end and exposed to an outside of the connector body at the other end. The bare chip is arranged in the inner room of the case and wire-bonded to each of the busbar and the connector terminal.

16 Claims, 12 Drawing Sheets

FIG. 14B

CURRENT SENSOR

CROSS REFERENCE TO RELATED APPLICATION

This application is based on and incorporates herein by reference Japanese Patent Application No. 2006-213574 filed on Aug. 4, 2006.

FIELD OF THE INVENTION

The present invention relates to a current sensor for measuring an electric current flowing through a busbar based on a resistance of the busbar and a voltage drop across the busbar.

BACKGROUND OF THE INVENTION

A current sensor has been proposed that detects an electric current flowing through a shunt resistor based on a resistance of the shunt resistor and a voltage drop across the shunt resistor. For example, this type of current sensor is used to detect charging and discharging currents of a vehicle battery, or an excitation current of an electric motor installed in an electric hybrid vehicle (EHV) and an electric vehicle (EV).

A shunt resistor disclosed in JP-A-H8-115802 includes L-shaped legs and has a low temperature coefficient. The shunt resistor is surface-mounted on a printed circuit board by soldering the L-shaped legs to the printed circuit board. A resistor member disclosed in JP-A-H9-213503 includes a molded conductor having exposed end portions that are plated to act as contacts. A current sensor disclosed in U.S. Pat. No. 4,675,255 includes a contact attached to a battery terminal of a vehicle, a shunt resistor electrically coupled to the contact, a detection circuit for detecting an electric current flowing though the shunt resistor, a pole body for covering the contact, and a housing that is unitary with the pole body and accommodates the shunt resistor and the detection circuit. These prior arts have the following problems:

Regarding the shunt resistor disclosed in JP-A-H8-115802 and the resistor member disclosed in JP-A-H9-213503, the shunt resistor and the resistor member are mounted on the printed circuit board through solder. Therefore, an open-circuit may be caused by a cold solder, or a short-circuit may be caused by a solder whisker. Further, since a typical printed circuit board has a low thermal resistance of about 110 degrees Celsius (° C.), the shunt resistor and the resistor member cannot be used under high temperature conditions, and cannot be used to detect a large current. For example, the shunt resistor and the resistor member cannot be used in an engine room, where the temperature increases up to 150° C., and cannot be used to detect the battery charging and discharging current, which reach about 1000 amperes (A). Furthermore, a detection circuit for detecting the current is constructed with multiple circuit elements mounted on the printed circuit board by the solder. Therefore, many manufacturing steps and cost are required to solder the circuit elements to the printed circuit board, and the problems due to the cold solder and the solder whisker may occur.

Regarding the current sensor disclosed in U.S. Pat. No. 4,675,255, space between the battery and a hood (i.e., bonnet) of the vehicle is required, because the contact is attached to the battery terminal of the vehicle. Further, the contact is attached to the battery terminal in a specific manner. Therefore, it is likely that the contact is incorrectly attached to the battery terminal during replacement of the battery. Further, the housing is not fixed to the battery, whereas the pole body, which is unitary with the housing, is fixed to the battery. Therefore, a large force is applied to a joint portion between the housing and the pole body and damages the joint portion.

SUMMARY OF THE INVENTION

In view of the above-described problem, it is an object of the present invention to provide a current sensor having a high reliably, a high strength, and a small size, and manufactured at low cost.

A current sensor includes an electrically conductive busbar, an electrically nonconductive case, a connector, a semiconductor bare chip, and first and second bonding wires. The busbar is interposable in a current line where an electric current to be measured flows in such a manner that the electric current flows through the busbar. The busbar has a first end portion connectable to a first side of the current line, a second end portion connectable to a second side of the current line, and a middle portion joining the first and second end portions.

The case includes a case body and a case lid. The case body encapsulates the middle portion of the busbar and has an inner room. The case lid is attached to the case body to cover the inner room. The connector includes a connector body and a connector terminal supported in the connector body. The connector body is joined to the case body. The connector terminal has a first portion exposed to the inner room of the case body and a second portion exposed to an outside of the connector body to be connectable to an external device.

The semiconductor bare chip is arranged in the inner room of the case body and has a detection circuit. The detection circuit detects the electric current based on a resistance of the busbar and a voltage drop across the busbar and outputs a data signal indicative of the detected electric current to the external device via the connector. The first bonding wire electrically couples the bare chip to the busbar so that the detection circuit in the bare chip can detect the electric current based on the resistance of the busbar and the voltage drop across the busbar. The second bonding wire electrically couples the bare chip to the first portion of the connector terminal of the connector so that the detection circuit in the bare chip can output the data signal to the external device via the connector.

The busbar and the detection circuit are assembled into the current sensor without soldering. In such an approach, the current sensor can avoid problems due to a cold solder and a solder whisker. Therefore, the current sensor can function reliably and accurately detect the electric current. The detection circuit is implemented on the bare chip as a monolithic integrated circuit. Thus, the current sensor can have a small size and be manufactured at low cost. The bare chip is arranged in the inner room of the case body, and the case lid covers the inner room. In such an approach, even when an external force is applied to the case body and the case lid, the bare chip can be prevented from being damaged by the external force. Therefore, the current sensor can have a high strength and function reliably.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENTS

First Embodiment

Referring to FIGS. 1A-7, a current sensor 10 according to a first embodiment of the present invention includes a busbar 11, a case body 12, a connector body 13, a case lid 14, a connector terminal 15, an integrated circuit (IC) chip 16, first and second bonding wires 17, 18, and first and second sealing members 19, 20. The current sensor 10 is used to detect, for example, charging and discharging currents of a vehicle battery.

Figure 6A:
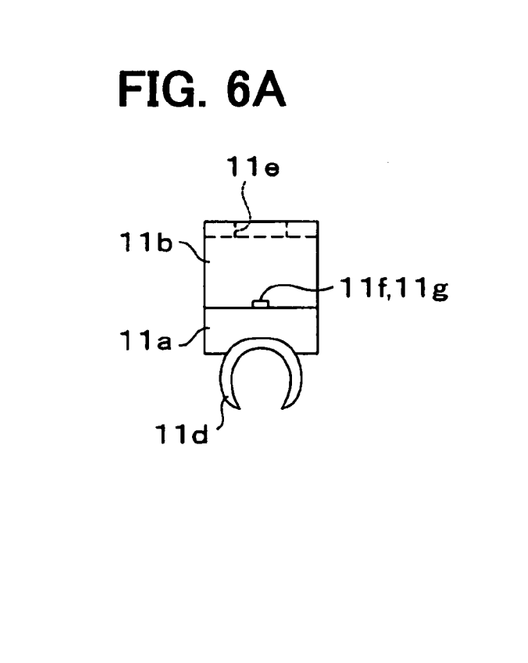
FIG. 6A is a side view of a busbar of the current sensor of FIG. 1A.
Figure 6B:
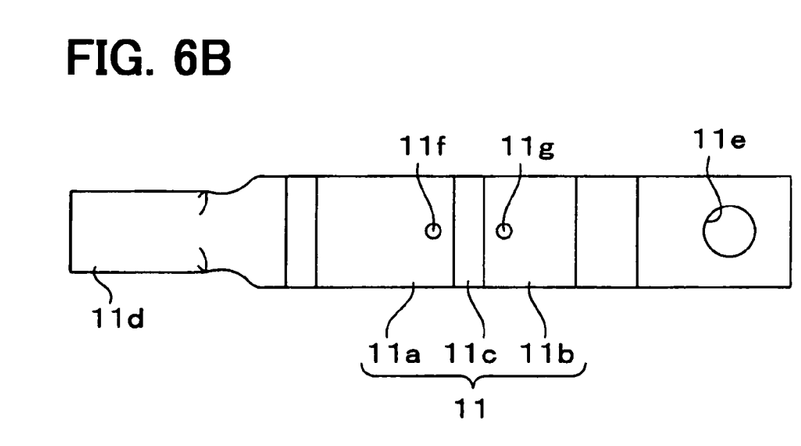
FIG. 6B is a top view of the busbar of FIG. 6A.
Figure 6C:
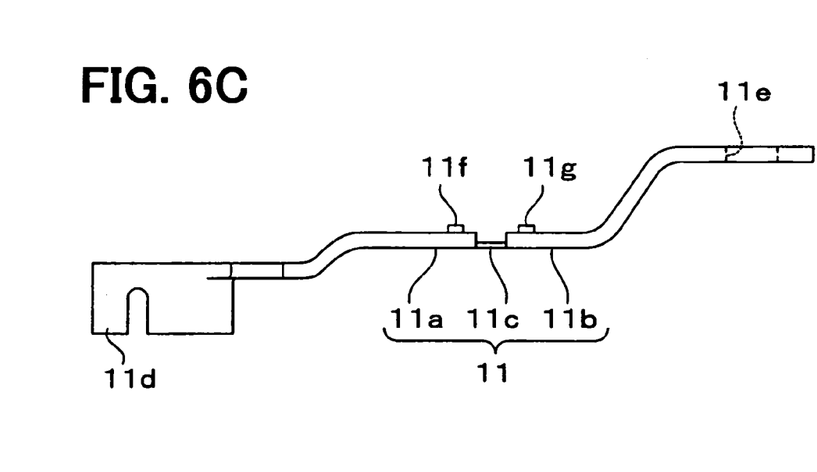
FIG. 6C is a front view of the busbar of FIG. 6A.

As shown, for example, in FIG. 6C, the busbar 11 has long length and includes first and second terminals 11a, 11b, and a shunt resistor 11c. The busbar 11 forms a ground terminal of a wiring harness. Each of the first and second terminals 11a, 11b is formed by bending a rectangular metal plate made of a low resistance material such as copper, or copper alloy. The shunt resistor 11c is welded between the first and second terminals 10a, 10b. The first and second terminals 10a, 10b are bent in an opposite direction relative to the shunt resistor 11c.

The first terminal 11a has a first end welded to the shunt resistor 11c and a second end provided with a crimp terminal 11d. The crimp terminal 11d has an U-shaped open barrel. The first and second ends of the first terminal 11a are at different heights in a thickness direction of the busbar 11 and parallel in a length direction of the busbar 11. The second terminal 11b has a third end welded to the shunt resistor 11c and a fourth end provided with a ring terminal 11e. The ring terminal 11e has a mounting hole. The third and fourth ends of the second terminal 11b are at different heights in the thickness direction and parallel in the length direction. The first end of the first terminal 11a has a first cylindrical electrode 11f that projects upwardly in the thickness direction. Also, the third end of the second terminal 11b has a second cylindrical electrode 11g that projects upwardly in the thickness direction.

The shunt resister 11c is made of a metallic material having a low resistance-temperature coefficient. For example, the shunt resistor 11c is made of a cupper-manganese-nickel alloy an alloy (i.e., manganin), a cupper-nickel alloy, a nickel-chrome alloy, an iron-chrome alloy, or the like. Therefore, the resistance of the shunt resistor 11c varies little with the temperature.

Figure 5:
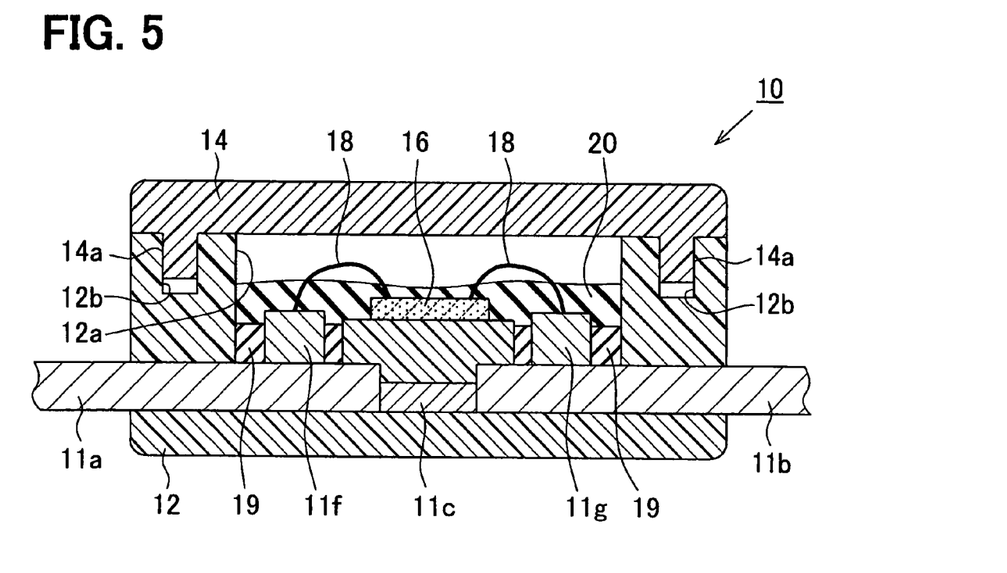
FIG. 5 is a cross-sectional view taken along line V-V of FIG. 1B.

As shown in FIG. 5, the shunt resistor 11c, a tip portion of the first end of the first terminal 11a, and a tip portion of the third end of the second terminal 11b are encapsulated in a bottom wall of the case body 12. The case body 12 has four sidewalls. The first terminal 11a penetrates a first sidewall of the case body 12 so that the second end of the first terminal 11a is exposed to an outside the case body 12. The second terminal 11b penetrates a second sidewall of the case body 12 so that the fourth end of the second terminal 11b is exposed to the outside of the case body 12. The first sidewall is opposite to the second sidewall.

Figure 4:
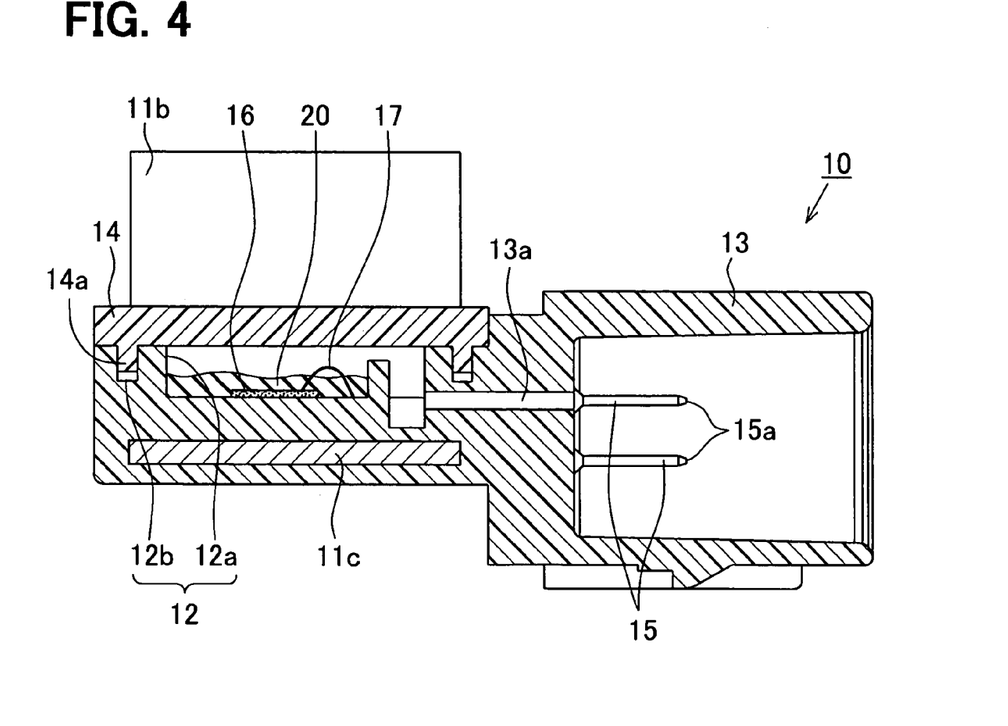
FIG. 4 is a cross-sectional view taken along line IV-IV of FIG. 1C.

The connector body 13 is integrally formed with the case body 12 by injection molding and extends from a third sidewall of the case body 12. Therefore, the connector body 13 is unitary with the case body 12. The case body 12 and the connector body 13 are made of an electrically nonconductive material. As shown in FIG. 4, the connector body 13 is shaped in a substantially hollow cylinder and has an air passage 13a. The inner room 12a of the case body 12 communicates with an inside of the connector body 13 via the air passage 13a. The case body 12 has a recessed groove 12b that has rectangular cross-section and surrounds the inner room 12a.

The case lid 14 has a protrusion 14a on one side, around its perimeter. As shown in FIG. 5, the protrusion 14a of the case lid 14 is engaged with the groove 12b of the case body 12. An adhesive (not shown) is applied between the groove 12b and the protrusion 14a so that the case lid 14 is securely fixed to the case body 12. Thus, the case lid 14 seals the inner room 12a of the case body 12.

Figure 1A:
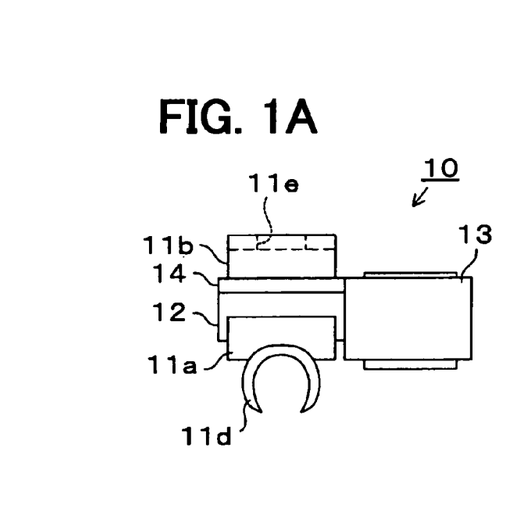
FIG. 1A is a side view of a current sensor according to a first embodiment of the present invention.
Figure 1B:
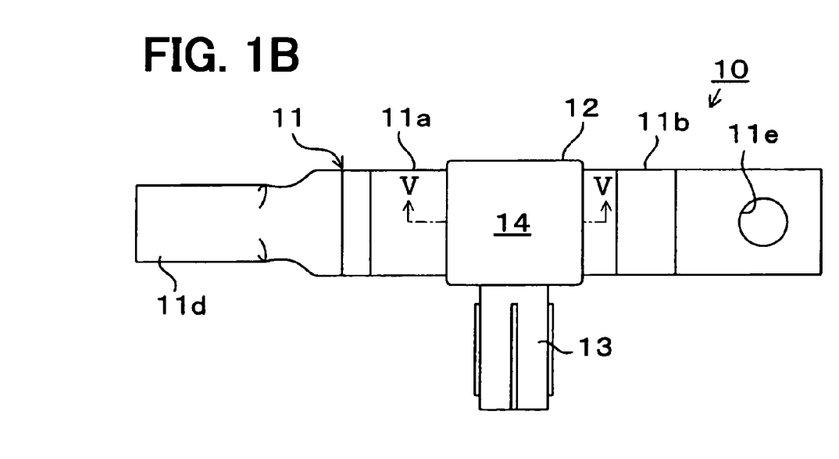
FIG. 1B is a top view of the current sensor of FIG. 1A.
Figure 1C:
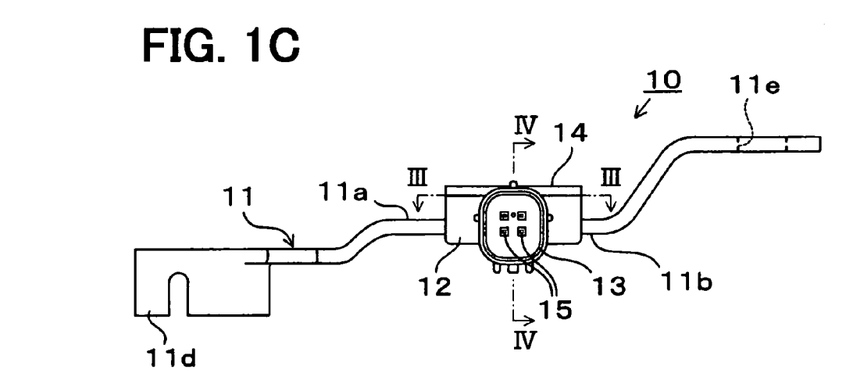
FIG. 1C is a front view of the current sensor of FIG. 1A.
Figure 2:
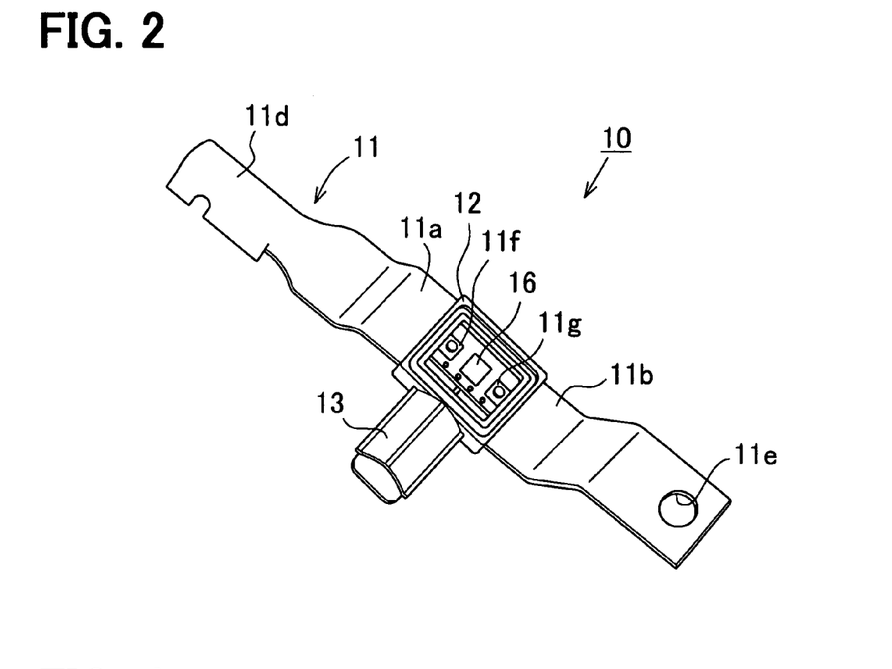
FIG. 2 is a perspective view of the current sensor of FIG. 1A, where a case lid is detached.
Figure 3:
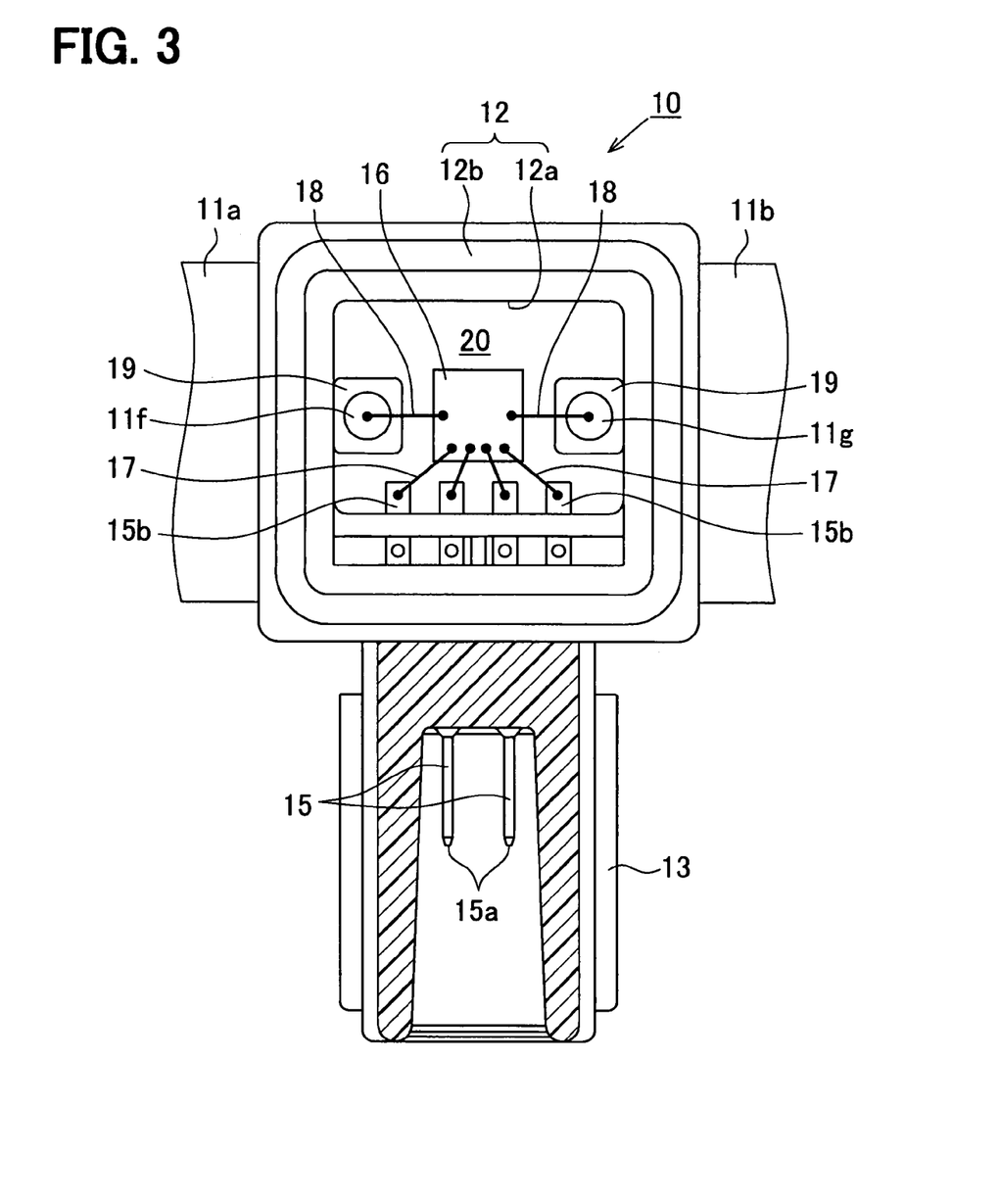
FIG. 3 is a cross-sectional view taken along line III-III of FIG. 1C.

The connector terminal 15 is supported in the connector body 13. As shown in FIG. 3, the connector terminal 15 has a first end 15a exposed to an outside of the connector body 13 and has a second end 15b exposed to a bottom surface of the inner room 12a of the case body 12.

The IC chip 16 is fixed to the bottom surface of the inner room 12a by an adhesive (not shown). The IC chip 16 is a monolithic IC and has a detection circuit integrated therein. The IC chip 16 is a bare chip. In other words, the IC chip 16 is not encapsulated in a molding resin.

The IC chip 16 has a bonding pad (not shown). As shown in FIG. 3, the bonding pad of the IC chip 16 is electrically connected to the second end 15b of the connector terminal 15 through the first bonding wire 17 by wire bonding. Further, the bonding pad of the IC chip 16 is electrically connected to each of the first and second electrodes 11f, 11g of the busbar 11 through the second bonding wire 18 by wire bonding. Thus, the IC chip 16 is electrically connected to each of the connector terminal 15 and the busbar 11 by a bare chip mounting technique.

As shown in FIG. 5, the busbar 11 is coated with the first sealing member 19 inside the inner room 12a of the case body 12 in such a manner that the first and second electrodes 11f, 11g are exposed so that the second bonding wire 18 is connected to each of the first and second electrodes 11f, 11g. The inner room 12a is filled with the second sealing member 20. Thus, the first and second electrodes 11f, 11g of the busbar 11, the second end 15b of the connector terminal 15, the IC chip 16, the first and second bonding wires 17, 18, and the first sealing member 19 are encapsulated in the second sealing member 20.

Figure 7:
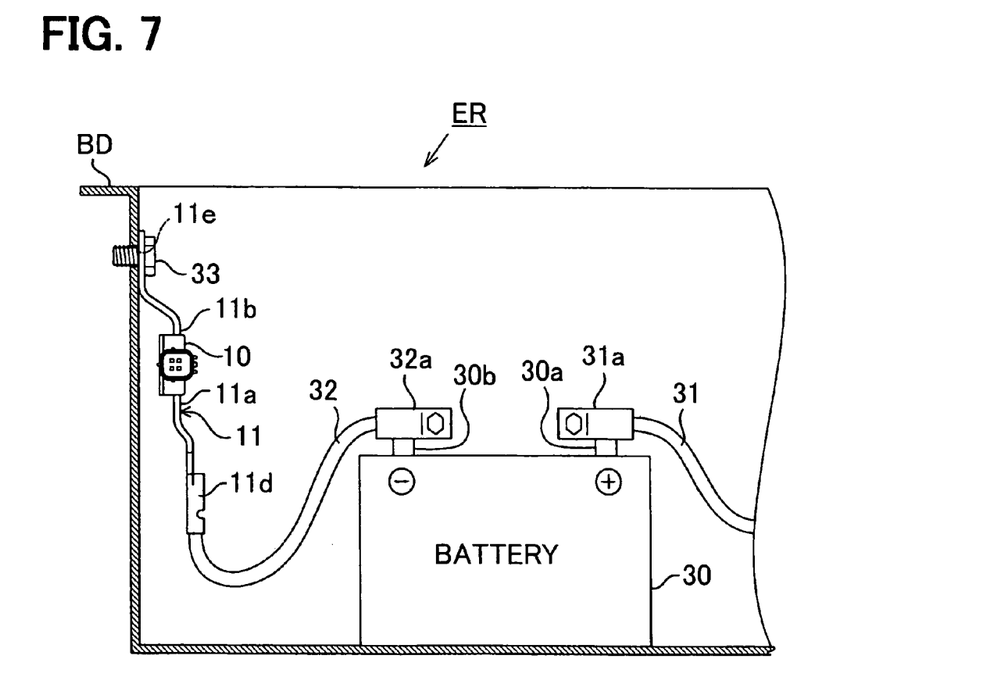
FIG. 7 is a cross sectional view of an engine room, where the current sensor of FIG. 1A is mounted to detect charging and discharging current of a vehicle battery.

As shown in FIG. 7, the current sensor 10 is mounted to a chassis BD of a vehicle. The chassis BD defines an engine room ER. The current sensor 10 measures charging and discharging currents of a battery 30 installed in the engine room ER.

A positive cable 31 of the wiring harness has a first end provided with a positive contact 31a and a second end connected to electric apparatus (not shown) installed in the vehicle. The positive contact 31a of the positive cable 31 is attached to a positive electrode 30a of the battery 30. A negative cable 32 of the wiring harness has a first end provided with a negative contact 32a and a second end connected to the crimp terminal 11d of the first terminal 11a of the busbar 11. The negative contact 32a is attached to a negative electrode 30b of the battery 30. In order to connect the negative cable 32 to the crimp terminal 11d of the busbar 11, the negative cable 32 is inserted into the open barrel of the crimp terminal 11d. The barrel of the crimp terminal 11d is then crimped with a tool which compresses the barrel and causes the negative cable 32 to be securely connected to the crimp terminal 11d.

The current sensor 10 is fixed to the chassis BD by a bolt 33 inserted through the mounting hole of the ring terminal 11e of the second terminal 11b of the busbar 11. Thus, the battery 30 is grounded to the chassis BD via the busbar 11 and the bolt 33.

The charging current flows from the negative electrode 30b of the battery 30 to the chassis BD via the negative contact 32a, the negative cable 32, the crimp terminal 11d, the first terminal 11a, the shunt resister 11c, the second terminal 11b, the ring terminal 11e, and the bolt 33. The discharging current flows from the chassis BD to the negative electrode 30b of the battery 30 via the bolt 33, the ring terminal 11e, the second terminal 11b, the shunt resister 11c, the first terminal 11a, the crimp terminal 11d, the negative cable 32, and the negative contact 32a. Thus, both the changing and discharging currents of the battery 30 flow through the shunt resister 11c.

As shown in FIG. 5, the first and second electrodes 11f, 11g are arranged near the shunt resister 11c and electrically connected to the IC chip 16 through the second bonding wire 18. The detection circuit in the IC chip 16 detects a voltage drop across the shunt resister 11c by detecting a potential difference between the first and second electrodes 11f, 11g. The detection circuit calculates the charging and discharging currents based on a resistance of the shunt resister 11c and the voltage drop across the shunt resister 11c by using Ohm's Law. The detection circuit in the IC chip 16 outputs a data signal indicative of the calculated current to an external device (not shown) connected to the connector terminal 15.

According to the first embodiment, the current sensor 10 measures the charging and discharging currents of the battery 30 and outputs the data signal indicative of the measured current. The shunt resister 11c is welded between the first and second terminals 11a, 11b, for example, by electronic beam welding, laser welding, resistance welding, or the like. In short, the shunt resister 11c is not soldered to the first and second terminals 11a, 11b and is not mounted on a printed circuit board. In such an approach, the current sensor 10 can avoid problems due to cold soldering and low thermal resistance of the printed circuit board. Therefore, the current sensor 10 can have high reliability. To improve an accuracy of detecting the charging and discharging currents of the battery 30, a resistance of a welded potion, where the shunt resister 11c is welded to the first and second terminals 11a, 11b, needs to be accurately adjusted. Therefore, it is preferable to use the electronic beam welding or the laser welding rather than the resistance welding.

The busbar 11 is connected to the negative cable 32 by inserting the negative cable 32 into the barrel of the crimp terminal 11d of the busbar 11 and by crimping the barrel. Also, the busbar 11 is attached to the chassis BD by inserting the bolt 33 through the mounting hole of the ring terminal 11e and by screwing the bolt 33 into the chassis BD. In short, the current sensor 10 is mounted in a solderless manner. Thus, the crimp terminal 11d and the ring terminal 11e facilitate the mounting of the current sensor 10.

According to the first embodiment, the case body 12 and the connector body 13 are formed as a single piece by injection molding. The case body 12 and the connector body 13 are made of rubber or synthetic resin having a high chemical resistance, a high thermal resistance, a high electrical insulation performance, and a high durability. For example, the case body 12 and the connector body 13 may be made of polyphenylene sulfide (PPS), polybutylene terepthalate (PBT), or the like.

The current sensor 10 does not use the printed circuit board, which has low thermal resistance. Further, the case body 12 and the connector body 13 are made of a material having the high thermal resistance. Therefore, the current sensor 10 can be used to detect a large current under high temperature conditions. For example, as described above, the current sensor 10 can be mounted in the engine room ER to detect the charging and discharging currents of the battery 30 installed in the engine room ER.

According to the first embodiment, the detection circuit for detecting the current flowing through the shunt resistor 11c is integrated in the IC chip 16, which is the bare chip. The IC chip 16 is electrically connected to the first end second electrodes 11f, 11g through the second bonding wire 18. The IC chip 16 is electrically connected to the second end 15b of the connector terminal 15 through the first bonding wire 17. Thus, the IC chip 16 is electrically connected to each of the connector terminal 15 and the busbar 11 by the bare chip mounting technique. In short, the detection circuit is built into the current sensor 10 in the solderless manner and is not mounted on the printed circuit board. In such an approach, the current sensor 10 can avoid the problems due to the cold soldering and the low thermal resistance of the printed circuit board. Therefore, the current sensor 10 can have high reliability. Further, since the detection circuit is constructed as a monolithic IC, the detection circuit can be manufactured at low cost and have a small size.

According to the first embodiment, the current sensor 10 is fixed to the chassis BD by the bolt 33 inserted through the mounting hole of the busbar 11. Therefore, even when there is little space between a hood (i.e., bonnet) of the vehicle and the battery 30, the current sensor 10 can be mounted in the engine room ER.

Conventionally, the negative cable 32 has a ring terminal, and the battery 30 is grounded to the chassis BD by inserting the bolt 33 into the chassis BD through a mounting hole of the ring terminal. As described above, the current sensor 10 is fixed to the chassis BD in the same manner in which the battery 30 is grounded to the chassis BD. Therefore, it is unlikely that the current sensor 10 is incorrectly mounted to the vehicle during replacement of the battery 30.

According to the first embodiment, the first and second terminals 11a, 11b, and the shunt resistor 11c are assembled into the busbar 11 by welding. Thus, even when a force is applied to the first terminal 11a by the negative cable 32, the busbar 11 can be prevented from being broken or deformed by the force. Further, the shunt resistor 11c is capsulated in the case body 12, and the IC chip 16 is accommodated in the inner room 12a of the case body 12. The case lid 14 seals the inner room 12a. Thus, even when a force is applied to the case body 12 and the case lid 14, the shunt resistor 11c and the IC chip 16 can be prevented from being broken by the force. Therefore, the current sensor 10 has a high strength and functions reliably.

The shunt resistor 11c can be enraptured in the case body 12 by insert molding the shunt resistor 11c into the case body 12. The first and second electrodes 11f, 11g of the busbar 11 are exposed to the bottom surface of the inner room 12a of the case body 12. Therefore, the IC chip 16, which is fixed to the bottom surface, can be easily wire-boned to the busbar 11 by the second bonding wire 18.

The first and second electrodes 11f, 11g may be unitary with the first and second terminals 11a, 11b, respectively. In this case, the first and second electrodes 11f, 11g are formed by stamping, milling, or the like. Alternatively, the first and second electrodes 11f, 11g may not be unitary with the first and second terminals 11a, 11b, respectively. In this case, the first and second electrodes 11f, 11g are welded to the first and second terminals 11a, 11b, respectively. Alternatively, the first and second electrodes 11f, 11g may be hammered into holes formed on the first and second terminals 11a, 11b, respectively.

Figure 8A:
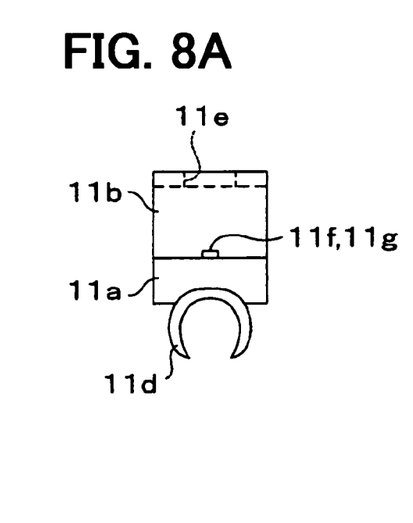
FIG. 8A is a side view of a busbar according to a modification of the first embodiment.
Figure 8B:
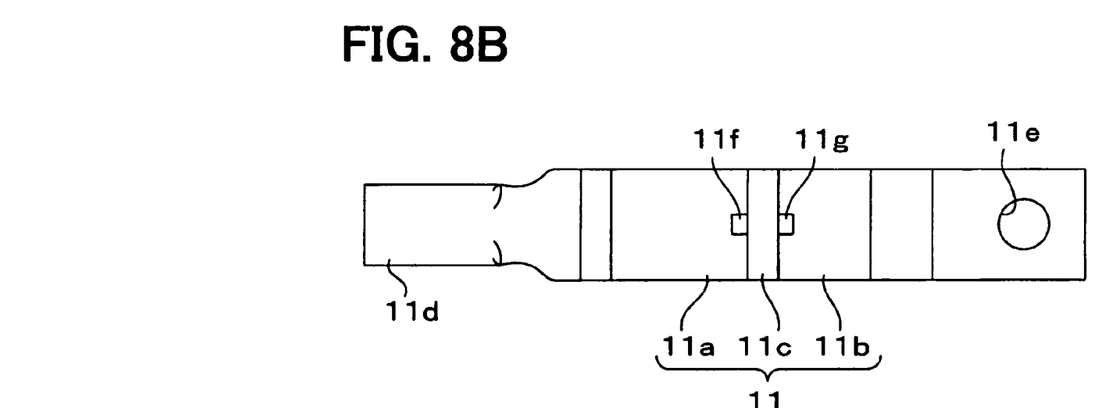
FIG. 8B is a top view of the busbar of FIG. 8A.
Figure 8C:
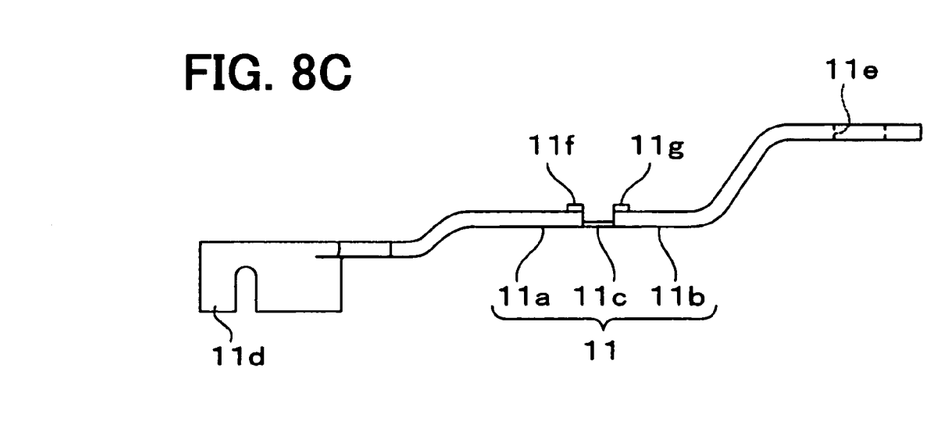
FIG. 8C is a front view of the busbar of FIG. 8A.

The first and second electrodes 11f, 11g may have other shapes than the cylindrical shape. For example, as shown in FIGS. 8A-8C, the first and second electrodes 11f, 11g may have a cubic shape.

According to the first embodiment, the case lid 14 is attached to the case body 12 by engaging the protrusion 14a of the case lid 14 with the groove 12b of the case body 12 so that the case body 12 and the case lid 14 can be in close contact with each other at their perimeters. The case lid 14 is fixed to the case body 12 by the adhesive, which is applied to the groove 12b or the protrusion 14a in advance. Thus, the case lid 14 seals the inner room 12a of the case body 12 in a liquid-tight manner. Alternatively, the case body 12 may have the protrusion 14a, and the case lid 14 may have the groove 12b.

As described previously, circuit components including the first and second electrodes 11f, 11g of the busbar 11, the second end 15b of the connector terminal 15, the IC chip 16, and the first and second bonding wires 17, 18 are accommodated in the inner room 12a, which is sealed by the case lid 14 in the liquid-tight manner. Therefore, even when liquid (e.g., engine oil, fuel, battery fluid, engine coolant, rain water, or the like) is splashed on the current sensor 10, the circuit components in the inner room 12a of the case body 12 can be protected from damages due to the splashed liquid.

The connector body 13 has the air passage 13a, via which the inner room 12a of the case body 12 communicates with the inside of the connector body 13. The air passage 13a allows hot air to escape out of the inner room 12a. Therefore, a thermosetting adhesive can be used to fix the case lid 14 to the case body 12. The diameter of the air passage 13a is determined by experiment such that the air passage 13a can release the hot air suitably. For example, the diameter of the air passage 13a may be about 0.8 millimeters (mm).

According to the first embodiment, the busbar 11 is coated with the first sealing member 19 inside the inner room 12a of the case body 12 in such a manner that the first and second electrodes 11f, 11g are exposed so that the second bonding wire 18 is connected to the first and second electrodes 11f, 11g. Further, the inner room 12a is filled with the second sealing member 20. Thus, the first and second electrodes 11f, 11g of the busbar 11, the second end 15b of the connector terminal 15, the IC chip 16, the first and second bonding wires 17, 18, and the first sealing member 19 are encapsulated in the second sealing member 20. In such an approach, even when there is clearance between the case body 12 and the case lid 14, and the splashed liquid enters the inner room 12a via the clearance, the first and second sealing members 19, 20 protect the circuit components from the damages due to the splashed liquid.

The first and second sealing members 19, 20 are made of rubber or synthetic resin that does not affect the IC chip 16 and has a high chemical resistance, a high thermal resistance, a high electrical insulation performance, and a high durability. For example, the first and second sealing members 19, 20 may be made of fluorosilicone rubber, fluorinated resin, or the like. Alternatively, the first and second sealing members 19, 20 may be made of a gel that has a low viscosity and can be cured under room temperature or higher temperature than the room temperature, because such a gel does not affect the IC chip 16.

The first and second bonding wires 17, 18 may be broken or disconnected from the IC chip 16 or the connector terminal 15 by vibration or thermal expansion of the second sealing member 20. To prevent this problem, the second sealing member 20 needs to have a low viscosity and a low thermal expansion coefficient. Further, to prevent this problem, it is preferable that there be a space between the case lid 14 and the second sealing member 20, as shown in FIG. 5. In short, it is preferable that the inner room 12a of the case body 12 be partially filled with the second sealing member 20. In such an approach, the first and second bonding wires 17, 18 are at least partially exposed so the break and disconnection of the first and second bonding wires 17, 18 can be prevented. Alternatively, if the vibration and thermal expansion of the second sealing member 20 can be negligible, the inner room 12a of the case body 12 may be entirely filled with the second sealing member 20.

The second end 15b of the connector terminal 15 and the first and the second electrodes 11f, 11g of the busbar 11 may be plated with gold or nickel. In such an approach, the IC chip 16 can be surely connected to the connector terminal 15 and the busbar 11 through the first and second bonding wires 17, 18, respectively.

The first and second terminals 11a, 11b of the busbar 11 except the first and second electrodes 11f, 11g may be plated with a corrosion resistant material such as zinc. In such an approach, the busbar 11 can be protected from corrosion, even when a liquid (e.g., battery fluid), which is capable of causing the busbar 11 to corrode, is adhered to the busbar 11.

Second Embodiment

Figure 9A:
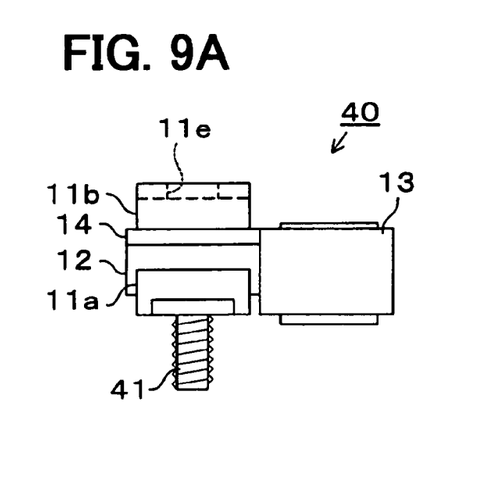
FIG. 9A is a side view of a current sensor according to a second embodiment of the present invention.
Figure 9B:
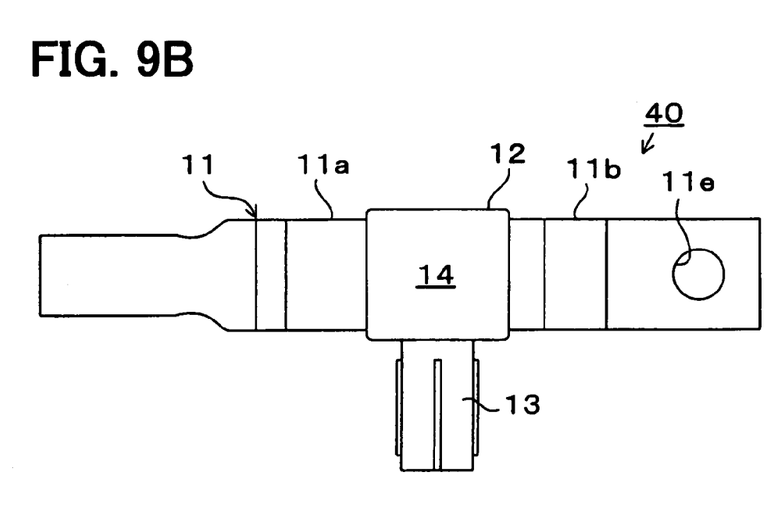
FIG. 9B is a top view of the current sensor of FIG. 9A.
Figure 9C:
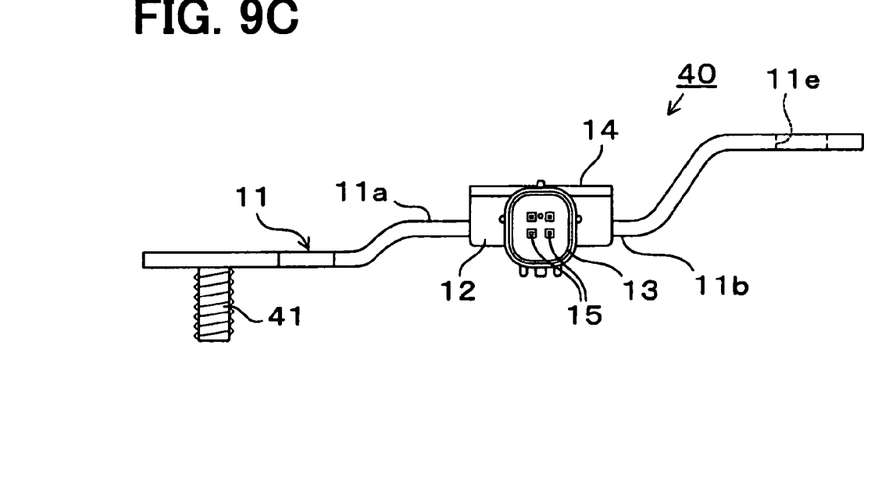
FIG. 9C is a front view of the current sensor of FIG. 9A.

A current sensor 40 according to a second embodiment of the present invention is shown in FIGS. 9A-9C. A difference between the current sensors 10, 40 is in that the crimp terminal 11d is replaced with a bolt 41. The bolt 41 is welded to the second end of the first terminal 11a of the busbar 11 by electronic beam welding, laser welding, resistance welding, or the like. Alternatively, the bolt 41 may be unitary with the first terminal 11a of the busbar 11.

In order to connect the busbar 11 to the negative cable 32, the bolt 41 is inserted through a mounting hole of a ring terminal (not shown) attached to the negative cable 32. A nut (not shown) is then tightened onto the bolt 41 so that the busbar 11 can be electrically connected to the negative cable 32.

According to the second embodiment, the busbar 11 is connected to the negative cable 32 by the bolt 41 instead of the crimp terminal 11d. In such an approach, the current sensor 40 can be attached to and detached from the negative cable 32 according to needs.

Third Embodiment

Figure 10A:
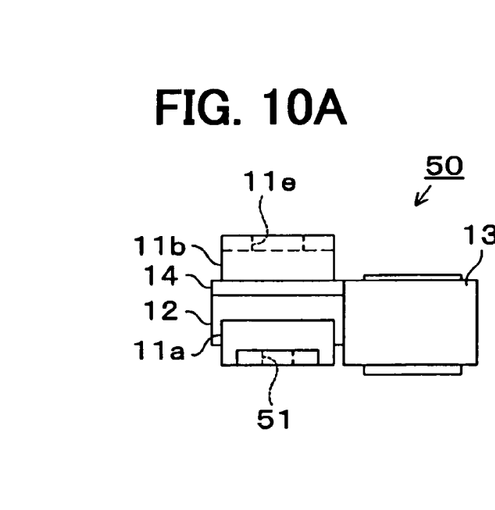
FIG. 10A is a side view of a current sensor according to a third embodiment of the present invention.
Figures 10B, 10C:
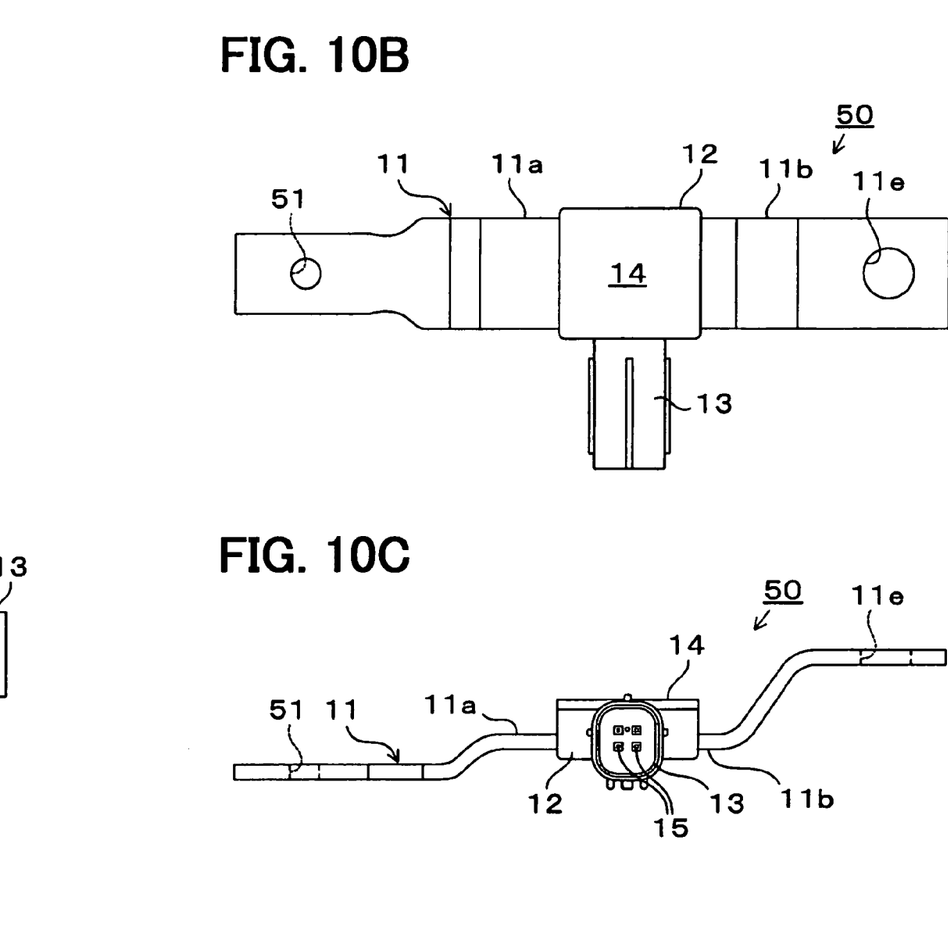
FIG. 10B is a top view of the current sensor of FIG. 10A.
FIG. 10C is a front view of the current sensor of FIG. 10A.

A current sensor 50 according to a third embodiment of the present invention is shown in FIGS. 10A-10C. A difference between the current sensor 50 and the current sensor 10 of the first embodiment is in that the crimp terminal 11d is replaced with a ring terminal 51. The ring terminal 51 has a mounting hole.

In order to connect the busbar 11 to the negative cable 32, a bolt (not shown) is inserted through the mounting hole of the ring terminal 51 and a mounting hole of a ring terminal (not shown) attached to the negative cable 32. A nut (not shown) is then tightened onto the bolt so that the busbar 11 can be electrically connected to the negative cable 32.

According to the third embodiment, the busbar 11 is connected to the negative cable 32 by the ring terminal 51 instead of the crimp terminal 11d. In such an approach, the current sensor 50 can be attached to and detached from the negative cable 32 according to needs.

Fourth Embodiment

Figure 11:
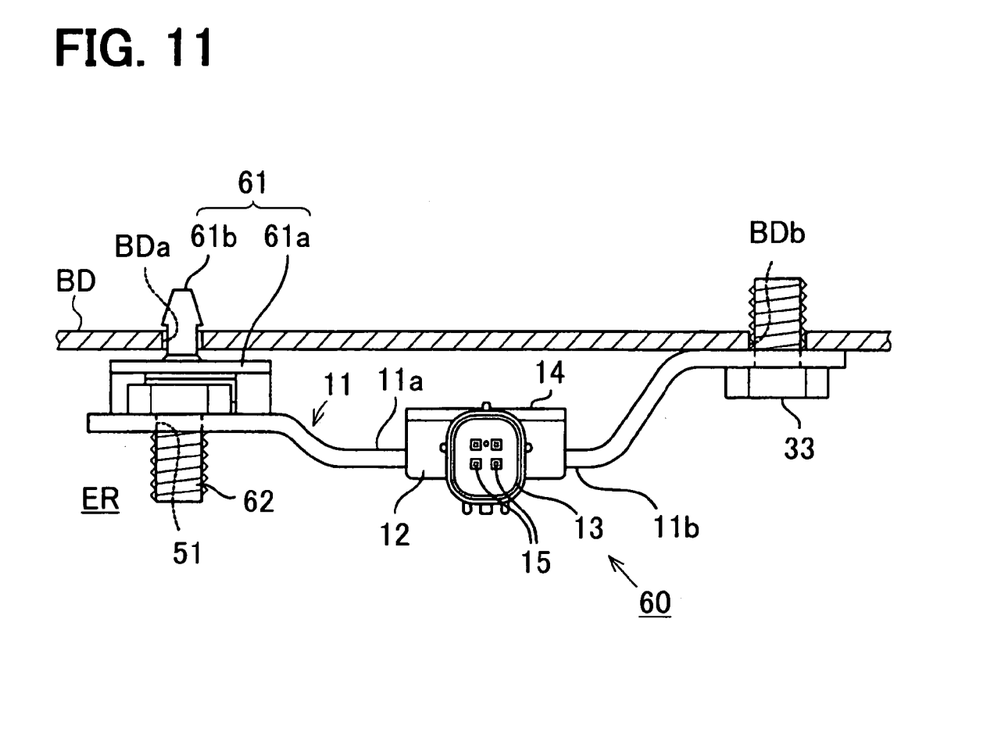
FIG. 11 is a front view of a current sensor according to a fourth embodiment of the present invention.

A current sensor 60 according to a fourth embodiment is shown in FIG. 11. A difference between the current sensors 60 and the current sensor 50 of the third embodiment is in that the first terminal 11a of the busbar 11 is provided with a mounting member 61 and a bolt 62.

The mounting member 61 includes a holder 61a and a snap fit pin 61b. The holder 61a is fixed to the second end of the first terminal 11a, and the snap fit pin 61b is fixed to the holder 61a. The snap fit pin 61b is mushroom shaped. The holder 61a and the snap fit pin 61b are made of rubber or synthetic resin having a high chemical resistance, a high thermal resistance, a high electrical insulation performance, and a high durability. For example, the holder 61a and the snap fit pin 61b may be made of polyphenylene sulfide (PPS), polybutylene terepthalate (PBT), or the like.

The bolt 62 is inserted through the mounting hole of the ring terminal 51. A head of the bolt 62 is locked by the holder 61a so that the bolt 62 can remain inserted through the mounting hole of the ring terminal 51. In order to connect the busbar 11 to the negative cable 32, the bolt 62 is inserted through a mounting hole of a ring terminal (not shown) attached to the negative cable 32. A nut (not shown) is then tightened onto the bolt 62 so that the busbar 11 can be electrically connected to the negative cable 32. In such an approach, the current sensor 60 can be attached to and detached from the negative cable 32 according to needs.

The chassis BD of the vehicle is provided with a snap fit hole BDa and a bolt hole BDb. The snap fit pin 61b is inserted in the snap fit hole BDa so that the first terminal 11a of the busbar 11 is mechanically connected to the chassis BD. The bolt 33 inserted through the mounting hole of the ring termi-nal 11e is inserted in the bolt hole BDb so that the second terminal 11b of the busbar 11 is mechanically and electrically connected to the chassis BD.

According to the fourth embodiment, the busbar 11 is fixed to the chassis BD at both ends. Thus, the current sensor 10 can be securely fixed to the chassis BD. Even when a large force is applied to the first terminal 11a by the negative cable 32, the busbar 11 can be prevented from being broken or deformed by the force.

Since the mounting member 61 is made of the electrically nonconductive material, the charging and discharging current of the battery 30 cannot flow from and to the chassis BD via the mounting member 61. Therefore, the current sensor 60 can function properly, although the current sensor 60 is fixed to the chassis BF at both ends.

The snap fit pin 61b of the mounting member 61 may have other shapes than the mushroom. For example, the snap fit pin 61b may be arrow shaped. A combination of the ring terminal 51 and the bolt 62 may be replaced with the crimp terminal 11d of the first embodiment or the welded bolt 41 of the second embodiment.

Fifth Embodiment

Figure 12A:
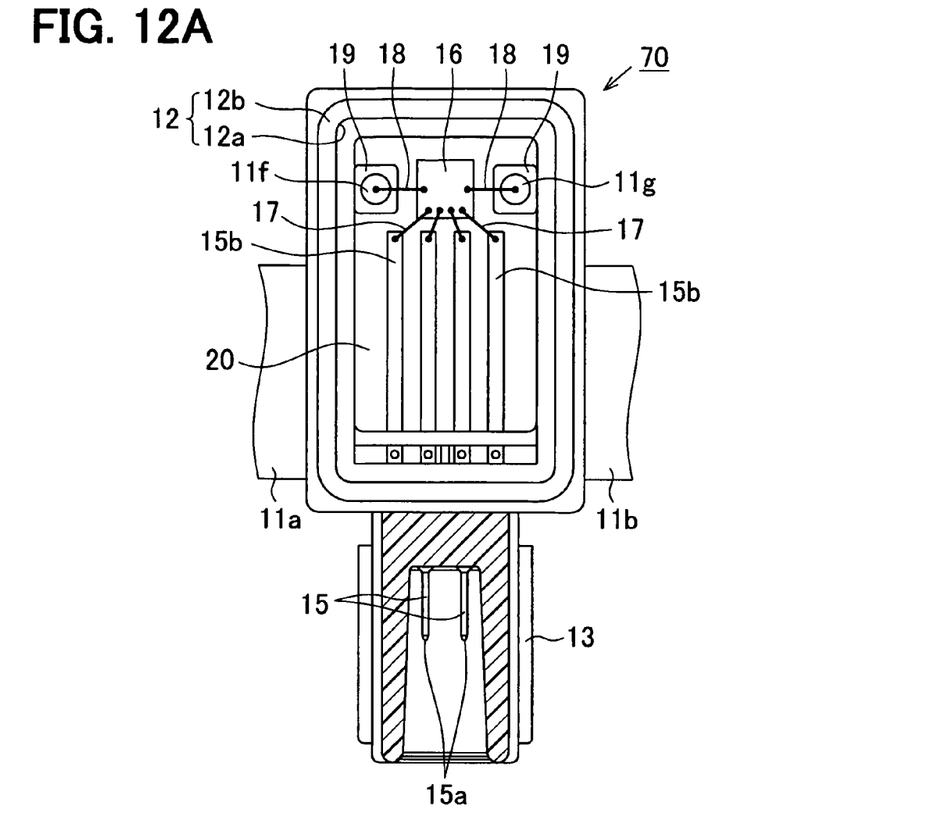
FIG. 12A is a cross-sectional view of a current sensor according to a fifth embodiment of the present invention.
Figure 12B:
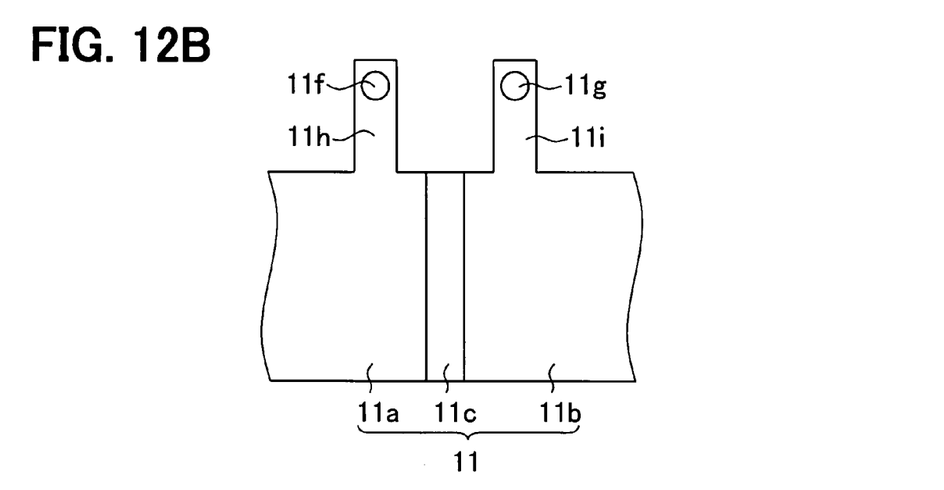
FIG. 12B is a top view of a portion of a busbar of the current sensor of FIG. 12A.

A current sensor 70 according to a fifth embodiment of the present invention is shown in FIGS. 12A, 12B. Differences between the current sensor 70 and the current sensor 10 of the first embodiment are as follows:

As shown in FIG. 12B, the first and second terminals 11a, 11b of the busbar 11 have first and second extension portions 11h, 11i, respectively, near the shunt resistor 11c. The first and second extension portions 11h, 11i extend in a direction perpendicular to the length of the busbar 11. The first and second extension portions 11h, 11i have tip portions provided with the first and second electrodes 11f, 11g, respectively. The first and second electrodes 11f, 11g projects upwardly in the thickness direction of the busbar 11. The first extension portion 11h has a constant width slightly larger than a diameter of the first electrode 11f. The second extension portion 11i has a constant width slightly larger than a diameter of the second electrode 11g. In addition to the shunt resistor 11c, the tip portion of the first end of the first terminal 11a, and the tip portion of the third end of the second terminal 11b, the first and second extension portions 11h, 11i are encapsulated in the bottom wall of the case body 12. Accordingly, the size of the case body 12 of the fifth embodiment is larger than that of the first embodiment.

As with the first embodiment, the bonding pad of the IC chip 16 is electrically connected to the second end 15b of the connector terminal 15 through the first bonding wire 17 by wire bonding. Accordingly, the length of the second end 15b of the fifth embodiment is greater than that of the first embodiment.

The inner room 12a of the case body 12 is located between the first and second extension portions 11h, 11i. The IC chip 16 is fixed to the bottom surface of the inner room 12a by the adhesive.

In the current sensor 10 according to the first embodiment, the inner room 12a is located over the shunt resistor 11c, and the IC chip 16 is fixed to the bottom surface of the inner boom 12a. In short, the IC chip 16 is positioned near the shunt resistor 11c. Therefore, heat generated by the shunt resistor 11c may be transmitted to the IC chip 16 and affect the IC chip 16. In contrast, in the current sensor 70 according to the fifth embodiment, the IC chip 16 is positioned away from the shunt resistor 11c. Therefore, the heat transmitted to the IC chip 16 can be reduced.

Sixth Embodiment

Figure 13A:
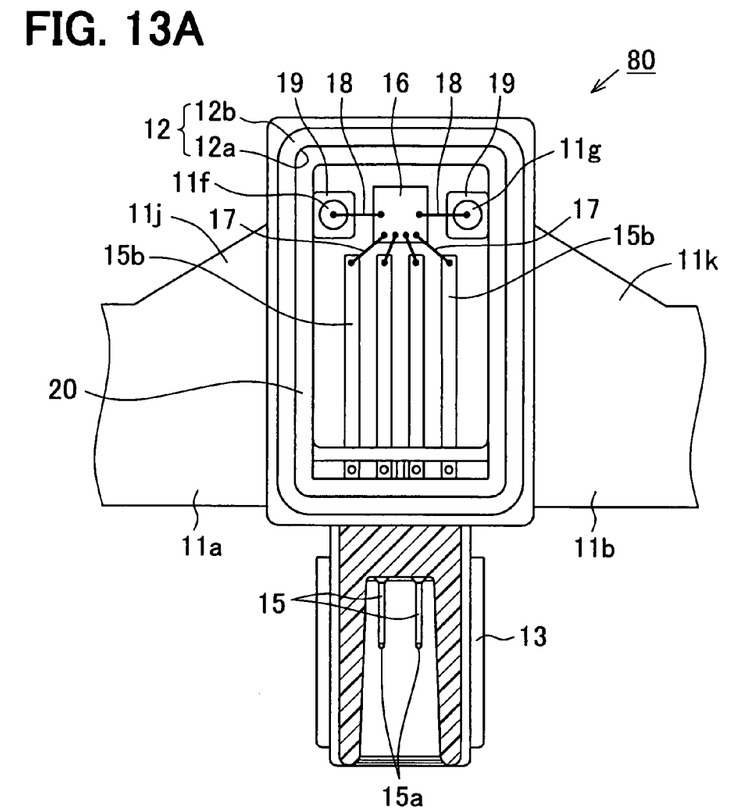
FIG. 13A is a cross-sectional view of a current sensor according to a sixth embodiment of the present invention.
Figure 13B:
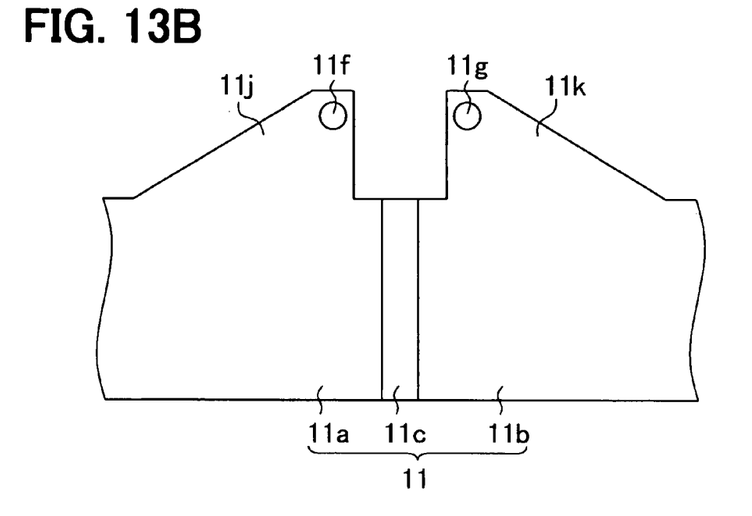
FIG. 13B is a top view of a portion of a busbar of the current sensor of FIG. 13A.

A current sensor 80 according to a sixth embodiment of the present invention is shown in FIGS. 13A, 13B. A difference between the current sensor 80 and the current sensor 70 of the fifth embodiment is in that the first and second extension portions 11h, 11i are replaced with first and second extension portions 11j, 11k.

As shown in FIG. 13B, like the first and second extension portions 11h, 11i, the first and second extension portions 11j, 11k extend in the direction perpendicular to the length of the busbar 11. The first and second extension portions 11j, 11k have tip portions provided with the first and second electrodes 11f, 11g, respectively. However, unlike the first and second extension portions 11h, 11i, the width of the first and second extension portions 11j, k is not constant. Specifically, the first and second extension portions 11j, 11k narrow toward the respective tip portions.

In addition to the shunt resistor 11c, the tip portion of the first end of the first terminal 11a, and the tip portion of the third end of the second terminal 11b, the first and second extension portions 11j, 11k are encapsulated in the bottom wall of the case body 12. Accordingly, the size of the case body 12 of the sixth embodiment is larger than that of the first embodiment.

As with the fifth embodiment, the IC chip 16 is positioned away from the shunt resistor 11c. Therefore, the heat transmitted to the IC chip 16 can be reduced.

Seventh Embodiment

Figure 14A:
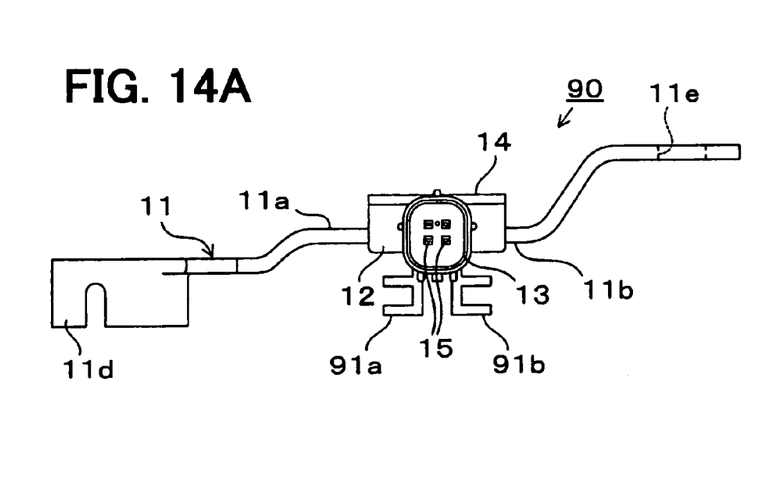
FIG. 14A is a front view of a current sensor according to a seventh embodiment of the present invention.
Figure 14B:
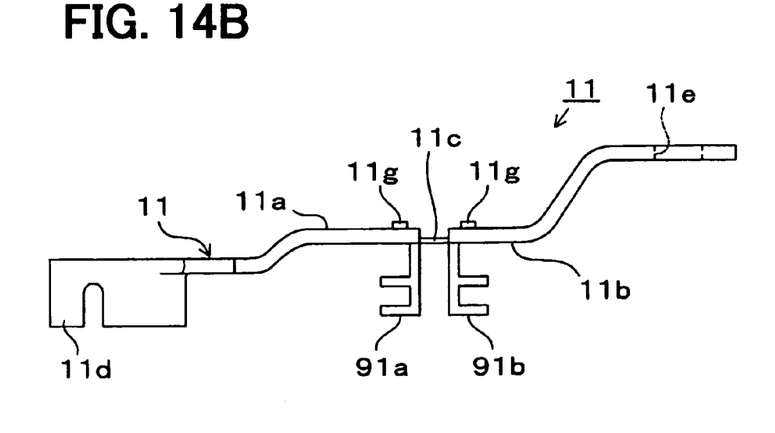
FIG. 14B is a front view of a busbar of the current sensor of FIG. 14A.
Figure 14C:
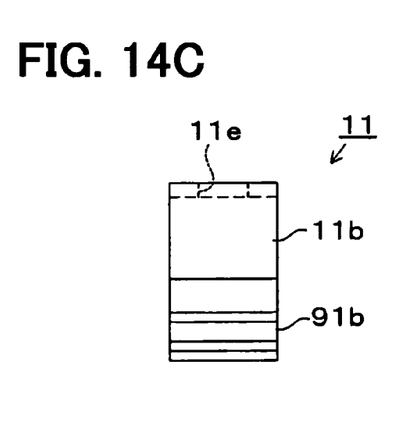
FIG. 14C is a side view of the busbar of FIG. 14B.

A current sensor 90 according to a seventh embodiment of the present invention is shown in FIGS. 14A-14C. A difference between the current sensor 90 and the current sensor 10 of the first embodiment is in that the current sensor 90 further includes first and second heat sinks 91a, 91b. Each of the first and second heat sinks 91a, 91b has multiple cooling fins for creating more surface area. The first heat sink 91a is attached to the first end of the first terminal 11a of the busbar 11. The second heat sink 91b is attached to the second end of the second terminal 11b of the busbar 11. Therefore, the first and second heat sinks 91a, 91b are positioned near the shunt resistor 11c. The first and second heat sinks 91a, 91b are exposed to the outside of the case body 12.

Each of the first and second heat sinks 91a, 91b is made of a metallic material having a low specific heat. For example, each of the first and second heat sinks 91a, 91b may be made of copper, copper alloy, or the like. The first and second heat sinks 91a, 91b may be unitary with the first and second terminals 11a, 11b, respectively. In this case, the first and second heat sinks 91a, 91b are formed by bending the first and second terminals 11a, 11b, respectively. Alternatively, the first and second heat sinks 91a, 91b may not be unitary with the first and second terminals 11a, 11b, respectively. In this case, the first and second heat sinks 91a, 91b are welded to the first and second terminals 11a, 11b, respectively.

According to the seventh embodiment, the first and second heat sinks 91a, 91b are provided near the shunt resistor 11c. The heat generated by the shunt register 11c is dissipated to the outside of the case body 12 through the first and second heat sinks 91a, 91b. Thus, the shunt resister 11c is cooled so that measurement errors due to temperature coefficient of the shunt resistor 11c can be reduced.

Modifications

The embodiment described above may be modified in various ways. For example, the busbar 11 may be made of one type of material. The first and second terminals 11a, 11b may be made of the same material as the shunt resistor 11c. In such an approach, manufacturing steps can be reduced so that manufacturing cost can be reduced. For example, the entire busbar 11 may be made of copper alloy (e.g., brass). In this case, the busbar 11 may be provided with a temperature sensor for detecting a temperature of the busbar 11. The detected current may be corrected based on the detected temperature, because copper alloy has a relatively high temperature coefficient of resistance.

The current sensors described in the embodiments can be used to detect various types of electric current. For example, the current sensors may be used to detect an excitation current of an electric motor installed in an electric hybrid vehicle (EHV) and an electric vehicle (EV).

Such changes and modifications are to be understood as being within the scope of the present invention as defined by the appended claims.

What is claimed is:

1. A current sensor for measuring an electric current flowing through a current line, the current sensor comprising:
    an electrically conductive busbar interposable in the current line to allow the electric current to flow through the busbar, the busbar having a first end portion connectable to a first side of the current line, a second end portion connectable to a second side of the current line, and a middle portion that joins the first and second end portions;
    an electrically nonconductive case including a case body and a case lid, the case body encapsulating the middle portion of the busbar and having an inner room, the case lid being attached to the case body to cover the inner room;
    a connector including a connector body and a connector terminal supported in the connector body, the connector body being joined to the case body, the connector terminal having a first portion exposed to the inner room of the case body and a second portion exposed to an outside of the connector body to be connectable to an external device;
    a semiconductor bare chip arranged in the inner room of the case body and having a detection circuit that detects the electric current based on a resistance of the busbar and a voltage drop across the busbar, the detection circuit outputting a data signal indicative of the detected electric current to the external device via the connector;
    a first bonding wire that electrically couples the bare chip to the busbar; and
    a second bonding wire that electrically couples the bare chip to the first portion of the connector terminal of the connector.

2. The current sensor according to claim 1, wherein the connector body of the connector is unitary with the case body of the case.

3. The current sensor according to claim 1, further comprising:
    an adhesive, wherein
    the case body of the case has a first engagement portion around its perimeter to surround an opening of the inner room,
    the case lid of the case has a second engagement portion around its perimeter,
    the first and second engagement portions are engaged with each other, and
    the adhesive is placed between the first and second engagement portions so that the inner room of the case body is sealed by the case lid in a liquid-tight manner.

4. The current sensor according to claim 1, wherein
the case body has a first air passage communicating with the inner room,
the connector body has a second air passage communicating with the outside of the connector body, and
the first and second air passages communicate with each other.

5. The current sensor according to claim 1, wherein
the busbar has an electrode exposed to the inner room of the case body,
the electrode includes a first electrode portion and a second electrode portion, and
the first electrode portion is electrically coupled to the bare chip by the first bonding wire.

6. The current sensor according to claim 5, further comprising:
a first sealing member for covering the second electrode portion of the electrode.

7. The current sensor according to claim 1, further comprising:
a second sealing member for at least partially filling the inner room of the case body.

8. The current sensor according to claim 1, wherein:
the middle portion of the busbar is welded between the first and second end portions of the busbar,
each of the first and second end portions of the busbar has a low electrical resistance, and
the middle portion of the busbar is a shunt resistor having a low temperature coefficient of resistance.

9. The current sensor according to claim 8, wherein
the bare chip is arranged away from the shunt resistor.

10. The current sensor according to claim 1, wherein
the first end portion of the busbar has a crimp terminal, and
the second end portion of the busbar has a ring terminal.

11. The current sensor according to claim 1, wherein
the first end portion of the busbar has a bolt, and
the second end portion of the busbar has a ring terminal.

12. The current sensor according to claim 1, wherein
each of the first and second end portions of the busbar has a ring terminal.

13. The current sensor according to claim 1, further comprising:
a snap fit provided near the first end portion of the busbar and attachable to an object where the current sensor is mounted.

14. The current sensor according to claim 1, wherein
the busbar has a heat radiator.

15. The current sensor according to claim 1, wherein
the busbar is at least partially plated with a corrosion resistant material.

16. The current sensor according to claim 1, wherein
the current line connects a metallic part of a vehicle and an negative electrode of a battery installed in the vehicle.

\* \* \* \* \*